United States Patent [19]

Youtsey et al.

[11] 4,079,156
[45] Mar. 14, 1978

[54] CONDUCTIVE METAL PIGMENTS

[75] Inventors: Karl J. Youtsey, Decatur, Ala.;
Steven A. Bradley, Northbrook, Ill.

[73] Assignee: UOP Inc., Des Plaines, Ill.

[21] Appl. No.: 706,337

[22] Filed: Jul. 19, 1976

Related U.S. Application Data

[63] Continuation-in-part of Ser. No. 556,358, Mar. 7, 1975, abandoned.

[51] Int. Cl.$^2$ .......................... B05B 5/12; H01B 1/02; H01B 1/04
[52] U.S. Cl. ...................................... 427/96; 252/500; 252/503; 252/512; 252/513; 106/290; 427/102
[58] Field of Search ............... 252/503, 512, 513, 500; 106/290; 427/96, 102

[56] References Cited

U.S. PATENT DOCUMENTS

| | | | |
|---|---|---|---|
| 2,795,680 | 6/1957 | Peck | 252/512 |
| 2,993,815 | 7/1961 | Treptow | 252/512 |
| 3,184,835 | 5/1965 | Coxe et al. | 75/206 |
| 3,381,255 | 4/1968 | Youmans | 427/102 |
| 3,647,532 | 3/1972 | Friedman et al. | 252/512 |
| 3,663,276 | 5/1972 | Allington | 427/102 |
| 3,711,428 | 1/1973 | Aycock | 252/503 |
| 3,794,518 | 2/1974 | Howell | 252/512 |
| 3,811,906 | 5/1974 | Short et al. | 106/290 |
| 3,843,379 | 10/1974 | Daiga | 106/290 |
| 3,969,278 | 7/1976 | Aksenov | 252/513 |

*Primary Examiner*—Ralph S. Kendall
*Assistant Examiner*—R. Eugene Varndell, Jr.
*Attorney, Agent, or Firm*—James R. Hoatson, Jr.; Raymond H. Nelson; William H. Page, II

[57] ABSTRACT

Conductive metal pigments which may be used in electrical devices are prepared by forming an alloy of a non-noble conductive metal and at least one oxidizable material, mixing the resulting alloy with a vitreous frit and an organic vehicle to form an ink, screening said ink onto a substrate, firing the alloy in an air atmosphere at a temperature in excess of about 500° C. and cooling the ink to produce a conductive pigment. The oxidizable material is preferentially oxidized during the firing with a concomitant non-oxidation of the non-noble conductive metal.

11 Claims, No Drawings

CONDUCTIVE METAL PIGMENTS

CROSS-REFERENCE TO RELATED APPLICATIONS

This application is a continuation-in-part of our co-pending application Ser. No. 556,358 filed Mar. 7, 1975, now abandoned all teachings of which are specifically incorporated herein by reference thereto.

BACKGROUND OF THE INVENTION

The use of thick-film resistors, capacitors, etc., parts in microcircuits is becoming of increasing importance in the electrical and electronic field. These thick-film components which comprise a layer of ink or paste which may be conductive, partially conductive or non-conductive in nature are deposited on a ceramic substrate by a process which is similar in nature to the silk screening method whereby a pattern of films is laid down to form conductors, dielectrics, resistors or capacitors. Following the deposition of the film on the substrate, the resulting material is then fired to a temperature usually ranging from about 750° to 1000° C. or more whereby the film is firmly affixed to the substrate. The resultant paste or ink substrate combination can form a microcircuit of passive components and, in addition, if so desired, discrete active components such as transistors or integrated circit chips can be attached separately to form a thick-film hybrid device. The term "thick-film" is used inasmuch as films of from about 1 to about 3 mils or more are used to form the resistive or conductive parts.

As hereinbefore set forth, the use of thick-film items or products is becoming more important due to the advantages which these items offer over other technology such as discrete parts, printed circuits, thin films, etc. For example, the designs which are used which have thick-film networks are easy, quick and flexible with low development costs and offer the design freedom and variety of parameter values which are normally available with discrete parts. Furthermore, circuits formed from thick films can combine many types of components such as high value capacitors, resistors, etc., which are not possible with monolithic products. In addition, the method of preparation of thick-film devices is simple inasmuch as the screen printing and heating processes are easy to control and automate. This is in contradistinction to thin-film networks which require a great degree of care in the sputtering and evaporating processes. The operation advantages which are possible when utilizing thick-film devices include high reliability which results from the use of fewer interconnection points. Furthermore, in contrast with discrete parts, the thick-film devices have improved resistance matching and temperature tracking capabilities.

All of the above-enumerated advantages will permit the use of thick-film devices in consumer radio and television products as well as in computers and in industrial electronic devices. These thick-film devices such as resistor networks may be used to replace the carbon resistor while hybrid modules including a thick-film device may be used in television circuits for the horizontal and vertical oscillators, high-voltage dividers and chroma signal processors. Additional uses for these devices are found in telephones, two-way radios, multiplexers, insulators and heating aids. Likewise, these devices may also be used in industrial control systems such as analog-to-digital and digital-to-analog converters, operation amplifiers, servo amplifiers, power amplifiers and power supply regulators, while in the automotive field hybrid thick-film devices may be used in fuel injection systems. It is thus readily apparent that thick-film devices find a wide variety of uses in many fields.

The silk screen conductor pastes which are currently in use are produced by combining a noble metal pigment such as gold, silver, platinum, palladium, etc., with a powder glass mixture and an organic vehicle. Thereafter the paste is silk screened onto a ceramic substrate and thereafter taken through a firing cycle at a temperature in the range hereinbefore set forth which first burns off the organic vehicle and thereafter melts the glass frit. On cooling, the product is a distribution of metal pigment in a glassy matrix which possesses an electrical conductivity sufficient to produce minimal resistance in the electric circuit.

In view of the high cost of noble metal pigments and the extensive use of thick-film devices, there is a strong incentive to replace the noble metal pigments with less costly conductors. However, inasmuch as the firing of the pigment-vehicle paste is effected in air at temperatures above 500° C. and usually above 700° C., it has been found necessary to use the noble metals due to the resistance of these metals to oxidation. Heretofore a drawback in using non-noble conductive metals such as nickel or copper has been that these metals are subject to a relatively ready oxidation of the metal with the result that the conductivity of the non-noble metal has been reduced to a point where it is insufficient in conductive properties to be useful in microcircuits.

Various U.S. patents have shown different inks. For example, U.S. Pat. No. 3,663,276 deals with inks which are used as resistors having a resistance greater than 100,000 ohms per square. However, this reference uses noble metals or noble metal oxides with non-noble metals of given concentrations. The non-noble metals oxidize upon firing, thus becoming nonconductive in nature and providing the desired high resistivity. Other U.S. patents such as U.S. Pat. Nos. 3,843,379; 3,811,906; and 3,374,110 describe utilizing a noble metal that is mixed with a vitreous frit, an organic binder, a solvent and is thereafter fired in an air atmosphere at an elevated temperature. These patents describe the use of noble metals such as gold, silver, palladium or mixtures thereof. As will hereinafter be shown in greater detail, the process of the present invention uses a non-noble metal alloy that can be air fired under elevated temperatures thus permitting the oxidation of the oxidizable material in preference to the non-noble metals under the conditions of firing. While certain U.S. patents such as U.S. Pat. Nos. 3,647,532 and 2,993,815 describe the use of non-noble metals as conductive inks, it is necessary that these inks utilize a furnace with an accurately controlled special type atmosphere. For example, in the former patent, the firing is effected in an essentially neutral or inert atmosphere except that it contains sufficient oxygen to burn out the temporary binder. This reference has an upper limit of 0.001 atmospheres of oxygen and claims that the upper limit of the oxygen which is present is 0.1% by volume. Furthermore, this reference also utilizes a reducing agent within the ink such as hydrazine hydrate which when decomposed at elevated temperatures releases hydrogen and reacts with excess oxygen thus preventing oxidation of the base matter in the essentially neutral atmosphere. The purpose of the low oxygen content in this patent is to burn off the binder but it cannot be any higher inasmuch as it will oxidize the conductive metal and render the ink electrically non-conductive. By utilizing this inert or essentially neutral atmosphere, the atmosphere is identical to a rare gas such as neon, argon, krypton, xenon, radon, etc., which show practically no tendency to combine with other elements. Therefore, an inert atmosphere is neither oxidizing nor reducing which is in contradistinction, as hereinafter set forth in greater detail, to the oxidizing atmosphere of the present invention. U.S. Pat. No. 2,993,815, hereinabove cited, uses two firing operations. The first firing is effected in an air, oxygen or mixed oxygen and inert gas environment so as to form the glass-metal bond. Following this, the second firing is effected in a reducing atmosphere possessing a critical composition of nitrogen, hydrogen and small amounts of oxygen to reduce the oxidized metal. Non-noble metals such as copper, nickel, alloys of nickel and copper or iron when fired in an air atmosphere at 840° C. are known to oxidize rapidly and therefore will no longer be able to be utilized as conductive metals.

It is also known that reducing agents can be added to the glass frit. However, this produces spotty conduction zones. The addition of antimony, chromium, charcoal or other oxygen scavengers can be mixed or blended into the conductive ink; but, on firing, reduction is non-uniform and will tend to occur only where the oxygen scavenger is present. U.S. Pat. No. 3,711,428 describes the mixing of charcoal with the ink. However, this action is taken to prevent blistering or cratering of the resistor, the charcoal burning off and thus leaving the metal exposed for oxidation. While this does not cause problems for the noble metal, there is substantial oxidation of non-noble metals such as copper. Another U.S. patent, namely, U.S. Pat. No. 2,795,680, utilizes a ceramic base to which is bonded a cross-linked epoxy resin and a conductive and non-conductive powder. The resin is cross-linked at 250° C. which is well below the firing temperature which is utilized in the present invention.

As will hereinafter be shown, it has now been discovered that non-noble conductive metals may be treated in a manner prior to the firing thereof so that the conductivity of the metal will be retained in an amount sufficient to permit its use in microcircuitry.

This invention relates to the utilization of conductive meal pigments and more specifically to non-noble metal conductive pigments which are prepared by forming an alloy of a non-noble conductive metal and at least one oxidizable material, mixing this non-noble conductive alloy with a vitreous frit and an organic vehicle, followed by firing the mixture in an air atmosphere at a temperature in excess of about 500° C.

As hereinbefore set forth, in view of the relatively expensive cost of noble metals such as gold, platinum, palladium, silver, etc., it is an economic advantage to utilize non-noble metals when preparing conductive pigments for use in thick-film devices. However, the non-noble metals must be able to withstand the oxidizing environment of the vitreous frit and firing operations. The mixture of the conductive metal, the glass frit and organic vehicle, when silk screened onto a substrate and taken through a firing cycle will burn off the organic vehicle in the frit and thereafter the glass will flow. When using a ceramic substrate on which the conductive pigment is combined, the glass frit will act to both bind the metal particles which form the conductive portion of the pigment together and, in addition, will also act to bind the particles to the substrate. It is therefore necessary to fire the combination at such a temperature so that the glass will flow and also for particle sintering to occur, and thus act in a manner to which it is intended.

It is therefore an object of this invention to provide a conductive metal pigment utilizing a non-noble metal as the conductive element.

A further object of this invention is to provide a process for preparing the conductive ink by which it is possible to utilize a non-noble metal as the conductive element while maintaining the conductive properties of the metal.

In one aspect an embodiment of this invention resides in a process for the preparation of a conductive pigment which comprises alloying a non-noble conductive metal with at least one oxidizable material selected from the group consisting of carbon, boron, silicon, aluminum, carbon-silicon, and boron-silicon, mixing the resulting alloy with a vitreous frit and an organic vehicle to form an ink, screening said ink onto a substrate, thereafter firing said ink in an oxidizing atmosphere containing at least 20% by volume of oxygen at a temperature in excess of about 500° C. for a period of time sufficient to oxidize said oxidizable material without oxidation of said non-noble metal, cooling the thus fired product to produce a conductive pigment.

A specific embodiment of this invention is found in a process for the preparation of a conductive pigment which comprises mixing an alloy of nickel, boron and silicon with a vitreous frit and an organic vehicle to produce an ink, screening said ink onto a ceramic substrate, firing said ink at a temperature in the range of from about 700° to about 900° C. in an oxidizing atmosphere containing at least 20% by volume of oxygen, cooling the conductive ink to produce a conductive pigment.

Other objects and embodiments will be found in the following further detailed description of the present invention.

As hereinbefore set forth it has now been discovered that a conductive pigment which is utilized in the preparation of a thick-film device may be prepared by utilizing a non-noble metal as the conductive element. Inasmuch as the conductive metals of the non-noble type which are usually used in circuits are relatively readily oxidized when heated in air, and that the usual method of preparing the conductive pigments for use in devices of the thick-film type were prepared by firing a combination of a conductive metal and a vehicle therefor, it was totally unexpected that such a pigment could be prepared in the usual manner when utilizing a non-noble metal such as nickel or copper as the conductive element. This result was totally unexpected in view of the fact that the prior art, especially as exemplified by U.S. Pat. No. 3,647,532 taught that an oxygen content above 0.1% causes substantial oxidation of copper with the result that the inks are unsatisfactory for the purpose intended and that, even at the low partial pressures as taught in the patent, it was necessary to add substantial amounts of a reducing agent to maintain the non-noble metal in a conductive state. The desired effect of the present invention was achieved by forming an alloy of the non-noble conductive metal with at least one other material which is more readily oxidizable. It is known that carbon oxidizes very rapidly and will not protect a substrate as effectively as other reducing agents. Likewise a nickel powder admixed with carbon powder does not possess relatively good conductivity. However, if a nickel-carbon alloy is prepared in a proper manner it has been found that the oxidation of carbon in the alloy is slower than if the carbon in the form of charcoal is mixed in with nickel, probably due to the fact that in the alloy the carbon must diffuse through the lattice to the surface. An alloy which is correctly formed will prevent localized oxidation and will not leave sections of the fired ink either non-conductive or highly resistive. It is therefore necessary to form an alloy which is composed of two or more metals or elements, one of which comprises the non-noble conductive metal while the other comprises an oxidizable material which is preferentially oxidized. By using such a preferentially oxidized material which includes, but is not limited to, carbon, boron, silicon, aluminum, etc., or combinations of these metals such as carbon-silicon, boron-silicon, etc., it is possible to obtain the desired result. Thus, for example, a more mobile alloying element such as boron or silicon can diffuse through the crystal lattice at an elevated temperature, being preferentially oxidized and thus prevents oxidation of the conductive non-noble metal. Therefore, the addition of a reducing agent to the vitreous frit becomes completely unnecessary for the preparation of a conductive pigment according to the process of this invention. One of the benefits which is attained by practicing the present invention is that any commercially vitreous frit or almost no glass whatever can be used, inasmuch as the non-noble metal alloy of the present invention forms its own glass. The utilization of this particular type of non-noble metal and readily oxidizable material alloy will produce uniformly thick films.

The alloy which is formed by combining a non-noble conductive metal such as nickel, copper, etc., and the preferentially oxidizable material of the type hereinbefore set forth is admixed with a vitreous frit and an organic vehicle to form an ink. Inasmuch as the preferentially oxidizable material will form its own glass and one purpose of the glass being to bind the conductive pigment to a substrate of the type hereinafter set forth in greater detail, a smaller amount of outside vitreous frit will be required in the formation of the ink. After screening said ink onto a substrate such as a ceramic which may be formed of alumina, silica-alumina, etc., the alloy is fired in an oxidizing atmosphere which is formed by the presence of an oxygen-containing gas such as air, oxygen, etc. The air firing operation which is effected at temperatures in excess of about 500° C. accomplishes two important functions. The first function is that the base or non-noble conductive metal such as nickel is not oxidized in the highly oxidizing atmosphere so that it remains highly and uniformly conductive, while the second function of the firing operation is that the preferentially oxidizable material forms the glass which fuses the particles together and to the substrate, thus acting as a barrier which will reduce the diffusion of oxygen into the non-noble metal. The term "air atmosphere" as used in the present specification will refer to an atmosphere consisting of nitrogen, oxygen, carbon dioxide, etc. The components of this air atmosphere, exclusive of water vapor, as stated in the *CRC Handbook Of Chemistry And Physics* consist of approximately 20.9% by volume of oxygen, 78.0% by volume of nitrogen, 0.33% by volume of carbon dioxide and 0.93% by volume of argon. Therefore, the oxidizing atmosphere in which the ink is fired will contain a lower limit of approximately 20% by volume of oxygen and may, if so desired, consist of 100% by volume when utilizing pure oxygen. After firing the alloy in this oxidizing atmosphere for a period of time which is sufficient to oxidize the preferentially oxidizable material without oxidation of the non-noble conductive metal, the thus fired product is cooled and recovered.

The vehicle which is utilized as one component of the conductive ink will usually comprise a vitreous frit or glass along with an organic vehicle which is utilized to reduce or to obtain the proper viscosity of the mixture in order to silk screen the conductive ink onto the desired substrate. For example, the vitreous frit may comprise a mixture of silica, alumina, lead oxide and boron oxide in varying concentrations with a resin binder such as ethyl cellulose while the organic vehicle may comprise a low cost organic material such as pineoil. The substrate can be a ceramic such as alumina, silica-alumina, etc. The conductive ink consisting of a mixture of the conductive pigment and the vehicle may comprise from about 80–95% of the conductive pigment and from about 5 to about 20% of the vitreous frit and organic vehicle.

The bi- or trimetallic alloys of the present invention may be prepared in any manner known in the art. For example, one method of preparing the alloy is to prepare a molten solution of the non-noble conductive metal such as nickel or copper and carbon, silicon, boron or alloys thereof following which the solution may be spray atomized to form spherical particles of the alloy. In this method, the material which is preferentially oxidized can be alloyed in the non-noble conductive metal as a second phase such as boron in nickel and/or dissolved in the metal as a single phase. In addition, a carbon alloy of nickel may also be produced by placing nickel powder in a carburizing medium such as a methane atmosphere. For example, carbon dissolves in nickel up to about 0.1 wt. % while silicon is soluble in nickel at concentrations up to about 5 wt. %. When the resulting alloy is utilized as a conductive pigment in a conductive ink formulation comprising the pigment and a vehicle which is thereafter silk screened onto a substrate and the resulting composite is then fired at a temperature above about 500° C., the dissolved carbon or silicon or mixtures of carbon and silicon or boron and silicon will diffuse to the surface of the non-noble metal such as nickel and is therefore available for preferential oxidation. The speed of the carbon diffusion is such that a monolayer of carbon on the surface of the nickel is formed in less than 1 second when the firing temperature is above about 800° C. It is contemplated within the scope of this invention that the preferential oxidation materials may be present in a range of from about 0.1 to about 10% by weight of the alloy. Some representative examples of alloys which may be used to form the conductive metal pigments of the present invention will include nickel plus silicon which is present in an amount of from about 0.1 to about 5% by weight, nickel plus a mixture of silicon which may be present in a range of from about 0.1 to about 4% and boron which may be present in a range of from about 0.1 to about 2% by weight, nickel plus boron which may be present in a range of from about 0.1 to about 2% by weight, nickel plus carbon which may be present in a range of from about 0.01 to about 0.1% by weight, nickel plus aluminum which may be present in a range of from about 1 to about 8% by weight, copper plus silicon which is present in an amount of from about 0.1 to about 4% by weight, copper plus a mixture of silicon which may be present in a range of from about 0.1 to about 4% and boron which may be present in a range of from about 0.1 to about 2% by weight, copper plus boron which may be present in a range of from about 0.1 to about 2% by weight, copper plus aluminum which may be present in a range of from about 1 to about 8% by weight, etc. It is to be understood that the above alloys are only representative of the class of alloys which may be present to prepare the conductive metal pigment, and that the present invention is not necessarily limited thereto.

As hereinbefore set forth by utilizing an alloy of the type which has been exemplified in the foregoing specification, it is possible to air fire a conductive ink containing this alloy as well as a vitreous frit and an organic vehicle on a substrate in an oxidizing atmosphere at temperatures above 500° C. and preferably in a range of from about 700° to about 900° C. to produce a conductive pigment in which the non-noble conductive metal retains the desired conductive characteristics without imparting a deleterious effect on the conductive property of the metal. The use of this type of firing technique insures that the base conductive metal is not oxidized to such a state whereby it will not be highly and uniformly conductive and will, in addition, maintain an excellent adhesion to the substrate. By utilizing this type of alloy, it is possible to avoid the necessity for firing the conductive pigment in an essentially neutral atmosphere which is neither oxidizing nor reducing in nature and which may require the presence of a reducing compound in order to prevent any oxidation, the amount of oxygen which may be tolerated being less than 0.1%.

The following examples are given for purposes of illustrating the process for preparing conductive metal inks from non-noble conductive metals which are alloyed with oxidizable materials. However, these examples are given merely for purposes of illustration and are not intended to limit the generally broad scope of the present invention in strict accordance therewith.

EXAMPLE I

Conductive elements were prepared by mixing from 80-95% of a metal powder with 5-20% of a vitreous frit and 5-20% of a pine oil organic vehicle. The vitreous frit which was utilized had a composition comprising 35.4% $SiO_2$, 2.52% $Al_2O_3$, 55.25% $PbO$ and 6.89% $B_2O_3$. The mixture was spread onto a cleaned alumina chip and the resulting element was then placed into a tube furnace. The firing schedule was to heat the device to a temperature ranging from 760° to 840° C. during a period of 20 minutes in an air atmosphere. When the temperature reached the desired figure, the device was held thereat for a period of time ranging from 10 to 15 minutes and then cooled to room temperature, usually at a rate of about 50° C. per minute. The resistance measurements were then conducted using a two point probe technique in which the probes were 0.75 inch apart, the resistance being measured with a General Radio Bridge Type 1650A.

To illustrate the lack of conductivity of non-noble metals which have been fired in an air atmosphere at the aforesaid temperatures, nickel powder was used in the first experiment. After the nickel powder and vitreous frit on the alumina chip had been heated to the aforesaid temperature in an air atmosphere and thereafter cooled, it was found that the pure nickel pigment had infinite resistance. When the nickel was subjected to a post treatment in a carbon monoxide atmosphere for a period of 60 minutes at a temperature of 760° C., the resulting film had a resistivity of $3.14 \times 10^{-3}$ ohm-centimeters. However, this resistivity only occurred after a two-step process, namely, an air atmosphere firing followed by a carbon monoxide post treatment. In like manner when inconel, stainless steel 316 and tungsten powders were fired at a temperature of 780° C. for a period of 10 minutes, the resulting films also had infinite resistance.

In contrast to the infinite resistance exhibited by the non-noble metals which had been fired at this elevated temperature, a conductive pigment comprising a mixture of silver and vitreous frit on alumina which was fired at a temperature of 760° C. exhibited a resistivity of $0.504 \times 10^{-3}$ ohm-centimeters and a mixture of 85% silver and 15% vitreous frit on alumina which was fired at a temperature of 840° C. for a period of 10 minutes exhibited a resistivity of $0.437 \times 10^{-3}$ ohm-centimeters. This establishes the fact that noble metals such as silver, gold, etc., can be fired in an air atmosphere at an elevated temperature and still maintain conductivity in contrast to the non-noble metals which lose all conductivity and have an infinite resistance.

EXAMPLE II

To illustrate how a non-noble conductive metal can be utilized in a conductive pigment after being fired in an air atmosphere at an elevated temperature, an alloy comprising 95% nickel, 3.5% silicon and 1.5% boron was used as the conductive material in a conductive device. The device was prepared by admixing 85% of this alloy with 15% of the vitreous frit and a pine oil organic vehicle, following which the mixture was then spread on a cleaned alumina chip and heated to a predetermined temperature, held at this temperature for a period of 10 minutes and thereafter cooled. The firing operation of the device was accomplished at a heating rate of 40° C. per minute followed by cooling at a rate of 50° C. per minute. Four samples of the device having between 1-15% vitreous frit which were heated to a temperature of 840° C. and maintained thereat for a period of 10 minutes exhibited a resistivity ranging from $4.25 \times 10^{-3}$ to $10.7 \times 10^{-3}$ ohm-centimeters, the thickness of the dried film ranging from 0.0034 to 0.0040 inch. A similar device which was fired at a temperature of 790° C. for a period of 10 minutes had a film thickness of 0.0038 inch and a resistivity of $11.1 \times 10^{-3}$ ohm-centimeters; a sample which was fired at a temperature of 890° C. for a period of 10 minutes had a thickness of 0.0035 inch and a resistivity of $12.8 \times 10^{-3}$ ohm-centimeters. This alloy powder of smaller particle size of -400 mesh having 15% vitreous frit and fired at 840° C. had a resistivity of $2.34 \times 10^{-3}$ ohm-centimeters and a thickness of dried film of 0.0017 inch. Electron Spectroscopy for Chemical Analysis data showed that the silicon and boron diffused through the crystal lattice to the surface where they were oxidized.

In a similar manner a sample of the alloy which was combined with the vitreous frit and organic vehicle and spread on an alumina chip was fired to a temperature of 760° C. for a period of 10 minutes. After cooling, the resistivity of the sample was measured and found to be $3.25 \times 10^{-3}$ ohm-centimeters. The sample was then refired at a temperature of 760° C. for a period of 10 minutes and thereafter rapidly cooled. A measurement of the resistivity of this refired sample showed that the resistivity was increased by less than a factor of 2, that is, $5.71 \times 10^{-3}$ ohm-centimeters. It was thus clearly demonstrated that a non-noble conductive pigment can be fired in an air atmosphere at an elevated temperature and still maintain an electrical conductivity which is similar in nature to that when using noble metals as the conductive element, the resistivities of the non-noble metal properties being only an order of magnitude more than the values which have been reported for commercial pastes which use a noble metal such as silver for the conductive element.

Likewise when other non-noble conductive metals such as copper are alloyed with aluminum, or mixtures of boron and silicon, it will be shown that the copper will possess a conductivity sufficient to enable the device to be used as an element in microcircuitry.

We claim as our invention:

1. A process for the preparation of a conductive pigment coated surface which comprises alloying a non-noble conductive metal with at least one oxidizable material selected from the group consisting of carbon, boron, silicon, carbon-silicon, and boron-silicon, mixing the resulting alloy with a vitreous frit and an organic vehicle to form an ink, screening said ink onto a substrate, thereafter firing said ink in an oxidizing atmosphere containing at least 20% by volume of oxygen at a temperature in excess of about 500° C. for a period of time sufficient to oxidize said oxidizable material without oxidation of said non-noble metal, cooling the thus fired product to produce a conductive pigment coated surface.

2. The process as set forth in claim 1 in which said alloy is fired at a temperature in the range of from about 700° to about 900° C.

3. The process as set forth in claim 1 in which said non-noble conductive metal is nickel.

4. The process as set forth in claim 1 in which said non-noble conductive metal is copper.

5. The process as set forth in claim 1 in which said oxidizable material is carbon.

6. The process as set forth in claim 1 in which said oxidizable material is silicon.

7. The process as set forth in claim 1 in which said oxidizable material is boron.

8. The process as set forth in claim 1 in which said oxidizable material is a combination of boron and silicon.

9. The process as set forth in claim 1 in which said oxidizable material is a combination of carbon and silicon.

10. The process as set forth in claim 1 in which said substrate is a ceramic.

11. The process as set forth in claim 1 in which the oxidizing atmosphere is an air atmosphere.

* * * * *